(12) United States Patent
Chen

(10) Patent No.: US 6,933,603 B2
(45) Date of Patent: Aug. 23, 2005

(54) MULTI-SUBSTRATE LAYER SEMICONDUCTOR PACKAGES AND METHOD FOR MAKING SAME

(75) Inventor: Tong Chen, Mountain View, CA (US)

(73) Assignee: Teledyne Technologies Incorporated, Los Angeles, CA (US)

(*) Notice: Subject to any disclaimer, the term of this patent is extended or adjusted under 35 U.S.C. 154(b) by 0 days.

(21) Appl. No.: 10/192,906

(22) Filed: Jul. 11, 2002

(65) Prior Publication Data

US 2004/0007776 A1 Jan. 15, 2004

(51) Int. Cl.[7] .............................................. H01L 23/34
(52) U.S. Cl. ...................... 257/713; 257/712; 257/706; 257/778; 361/736; 361/711
(58) Field of Search .......................... 257/99, 678, 690, 257/712–713, 796, 706, 778, 737–738; 361/735–736, 704, 709, 711–712, 767

(56) References Cited

U.S. PATENT DOCUMENTS

| | | | |
|---|---|---|---|
| 4,309,677 A | * | 1/1982 | Goldman ................... 333/81 A |
| 5,065,123 A | | 11/1991 | Heckaman et al. |
| 5,311,059 A | * | 5/1994 | Banerji et al. .............. 257/778 |
| 5,355,283 A | * | 10/1994 | Marrs et al. ................ 361/760 |
| 5,404,273 A | * | 4/1995 | Akagawa .................... 361/707 |
| 5,528,203 A | | 6/1996 | Mohwinkel et al. |
| 5,561,085 A | | 10/1996 | Gorowitz et al. |
| 5,612,257 A | | 3/1997 | Tserng et al. |
| 5,614,442 A | | 3/1997 | Tserng |
| 5,635,762 A | | 6/1997 | Gamand |
| 5,668,512 A | | 9/1997 | Mohwinkel et al. |

(Continued)

OTHER PUBLICATIONS

Sakai et al., "A Novel Millimeter–Wave IC on Si Substrate Using Flip–Chip Bonding Technology," *IEICE Trans. Electron*, vol. E78–C, No. 8, Aug. 1995, pp. 971–978.

Ohiso et al., "Flip–Chip Bonded 0.85–µm Bottom–Emitting Vertical–Cavity Laser Array on an AlGaAs Substrate," *IEEE Photonics Technology Letters*, vol. 8, No. 9, Sep. 1996, pp. 1115–1117.

Krems et al., "Avoiding Cross Talk and Feed Back Effects In Packaging Coplaner Millimeter–Wave Circuits," *1998 IEEE MTT–S Digest*, pp. 1091–1094.

Wadsworth et al., "Flip Chip GaAs MMICs for Microwave MCM–D Applications," *Advancing Microelectronics*, May/Jun. 1998, pp. 22–25.

Burggraaf, "Chip scale and flip chip: Attractive Solutions," *Solid State Technology*, Jul. 1998, pp. 239–246.

Peter, "Solder Flip–Chip and CSP Assembly System," *Chip Scale Review*, Jul./Aug. 1999, pp. 58–62.

*Primary Examiner*—Amir Zarabian
*Assistant Examiner*—Thanh Y. Tran
(74) *Attorney, Agent, or Firm*—Kirkpatrick & Lockhart Nicholson Graham LLP

(57) ABSTRACT

A device, comprising a first substrate having a transmission line formed on a surface thereof and a second substrate connected to the first substrate and the transmission line such that the transmission line is substantially between the first substrate and the second substrate. The device also includes a circuit chip connected to the transmission line.

24 Claims, 2 Drawing Sheets

U.S. PATENT DOCUMENTS

| | | | |
|---|---|---|---|
| 5,708,283 A | 1/1998 | Wen et al. | |
| 5,760,650 A | 6/1998 | Faulkner et al. | |
| 5,835,355 A * | 11/1998 | Dordi | 361/760 |
| 5,847,453 A | 12/1998 | Uematsu et al. | |
| 5,877,560 A | 3/1999 | Wen et al. | |
| 5,903,239 A * | 5/1999 | Takahashi et al. | 343/700 MS |
| 5,932,926 A | 8/1999 | Maruyama et al. | |
| 5,945,734 A | 8/1999 | McKay | |
| 5,949,140 A | 9/1999 | Nishi et al. | |
| 5,986,506 A * | 11/1999 | Oga | 330/286 |
| 5,990,757 A | 11/1999 | Tonomura et al. | |
| 5,998,817 A | 12/1999 | Wen et al. | |
| 6,020,629 A * | 2/2000 | Farnworth et al. | 257/686 |
| 6,124,636 A | 9/2000 | Kusamitsu | |
| 6,320,543 B1 * | 11/2001 | Ohata et al. | 343/700 MS |
| 6,507,110 B1 * | 1/2003 | Chai et al. | 257/728 |
| 6,566,748 B1 * | 5/2003 | Shimizu et al. | 257/704 |
| 6,714,113 B1 * | 3/2004 | Abadeer et al. | 336/223 |
| 6,731,015 B2 * | 5/2004 | Wu et al. | 257/796 |
| 2003/0132529 A1 * | 7/2003 | Yeo et al. | 257/778 |
| 2003/0151133 A1 * | 8/2003 | Kinayman et al. | 257/713 |

* cited by examiner

MULTI-SUBSTRATE LAYER SEMICONDUCTOR PACKAGES AND METHOD FOR MAKING SAME

BACKGROUND

In the semiconductor industry, circuits, such as monolithic microwave integrated circuits (MMICs), are typically electrically connected to a substrate having peripheral circuitry according to traditional interconnect approaches using, for example, wire bonding or flip chip technology. Flip chip mounting has found wide application in the semiconductor packaging and assembly industry for digital and low frequency analog chips because it typically provides a cost and size reduction for the resulting semiconductor package. In contrast to the wire bonding interconnect approach, the flip chip mounting technique involves flipping the chip and connecting the chip's top surface to the substrate. A number of electrically conductive flip chip bumps, depending upon the complexity of the chip, are typically provided between the chip's top surface and the substrate to provide an electrical connection between the chip and the substrate, and hence the other components connected to the top surface of the substrate.

SUMMARY

The present invention, in one embodiment, is directed to a device, comprising a first substrate having a transmission line formed on a surface thereof and a second substrate connected to the first substrate and the transmission line such that the transmission line is substantially between the first substrate and the second substrate. The device also includes a circuit chip connected to the transmission line.

The present invention, in one embodiment, is directed to a microwave device, comprising a first substrate having an underside and a transmission line formed on the underside and a second substrate connected to the underside of the first substrate and the transmission line. The device also comprises a microwave circuit chip connected, via a conductive bump, to the transmission line and a ground plate connected to the microwave circuit chip and the second substrate.

The present invention, in one embodiment, is directed to a method of fabricating a device, comprising forming a transmission line on a bottom surface of a first substrate and attaching a second substrate to the bottom surface of the first substrate and the transmission line such that the transmission line is substantially between the first substrate and the second substrate. The method also comprises attaching a circuit chip to the transmission line.

DESCRIPTION OF THE FIGURES

For the present invention to be clearly understood and readily practiced, the present invention will be described in conjunction with the following figures, wherein.

DESCRIPTION

Figure 1:
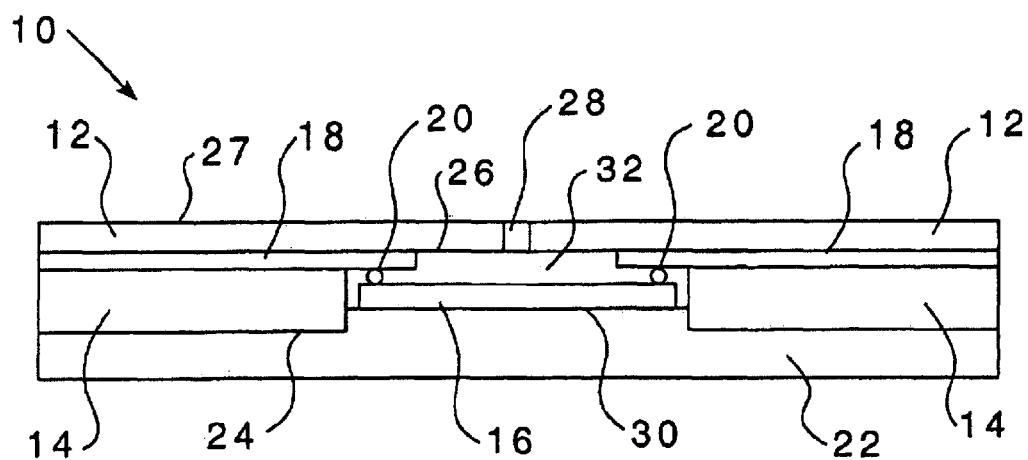
FIGS. 1 and 3 are cross-sectional side-views of a semiconductor device according to various embodiments of the present invention.

FIG. 1 is a cross-sectional side view of a semiconductor device 10 according to one embodiment of the present invention. The device 10 includes substrates 12, 14 and a circuit chip, or die, 16 electrically connected to transmission lines 18. The circuit chip 16 is electrically connected to the transmission lines 18 via a number of electrically conductive bumps 20. The device 10 may also include an electrically conductive ground plate and heat sink 22.

The substrates 12, 14 may be constructed of an insulative material such as, for example, low temperature co-fired ceramic (LTCC), high temperature co-fired ceramic (HTCC), glass, woven fiberglass laminates, and Teflon®-based laminates, including Duroid® microwave laminates, or any other suitable material. The ground plate 22 may be electrically conductive and may be constructed of, for example, metal, such as gold, silver, aluminum or copper, or an insulator having a conductive coating. If, for example, the circuit chip 16 has no backside grounded, the ground plate 22 may be constructed of a non-conductive material. The ground plate 22 may be formed from a single piece of material, or it may be formed from the bonding of several pieces, even of different material. The ground plate 22 may be mounted to the substrate 14, for example, by epoxy bonding.

The transmission lines 18 may include an electrically conductive material such as, for example, aluminum or copper, and may be formed on a lower surface 26 of the substrate 12 by, for example, conventional thick or thin film photolithographic deposition and etching techniques. In various embodiments of the present invention, the transmission lines 18 may include transmission lines for, for example, various microwave transmission modes including, for example, microstrip, embedded microstripline, co-planar waveguide (CPW), coupled line, grounded CPW, and stripline transmission modes. The transmission lines 18 may be grounded, for example, via grounds placed on a top surface 27 of the substrate 12, on a bottom surface 24 of the substrate 14, or co-planar with the transmission lines 18.

The electrically conductive bumps 20 provide an electrical connection between the transmission lines 18 and bonding pads, or electrodes, of the circuit chip 16. Ends of the transmission lines 18 form bonding pads for the substrate 12. The bumps 20 may be formed, for example, of metal, such as gold, or conductive polymers, and may have a diameter of approximately four mills or less.

According to one embodiment of the present invention, the device 10 includes an isolation device 28 disposed in the substrate 12. The isolation device 28 may be used, for example, to provide electromagnetic isolation between transmission lines 18 of the device 10 and therefore minimize coupling between the transmission lines 18. Coupling between the transmission lines 18 may result, for example, when the circuit chip 16 is relatively small, such as when the chip 16 includes, for example, only a single transistor, or where the chip 16 has a very high gain. It can be understood that other isolation techniques may be used instead of or in addition to the isolation device 28 such as, for example, by inserting ground isolation traces, via arrays and slots.

According to one embodiment, the isolation device 28 may include microwave frequency radiation absorbing material such as, for example, Eccosorb® microwave absorber (Eccosorb is a federally registered trademark of Emerson & Cuming, Inc., Randolph, Mass.). According to another embodiment, the isolation device 28 may include an electrically conductive material, such as metal or conductive polymers. For such an embodiment, the isolation device 28 may be coupled to ground, such as the interface between the lower surface 24 of the substrate 14 and the ground plate 22.

The circuit chip 16 may be a die having fabricated thereon a circuit such as, for example, a microwave circuit. The die may be fabricated from, for example, gallium arsenide (GaAs), although other semiconductor materials, such as silicon, gallium nitride (GaN), and silicon carbide, may also be used. The circuit may be any type of circuit including, for example, a transistor, such as a field effect transistor (FET) or a heterojunction bipolar transistor (HBT), or a number of transistors. For example, the circuit may be a power amplifier having different amplification stages. According to another embodiment, the circuit may be a low noise amplifier. In various embodiments, the circuit may be, for example, a monolithic microwave integrated circuit (MMIC) including, for example, a power amplifier MMIC, a low noise amplifier MMIC, an up-down converter MMIC, a mixer MMIC, a transceiver MMIC, and an oscillator MMIC. Such MMICs may, for example, support a microstrip transmission mode.

Figure 3:
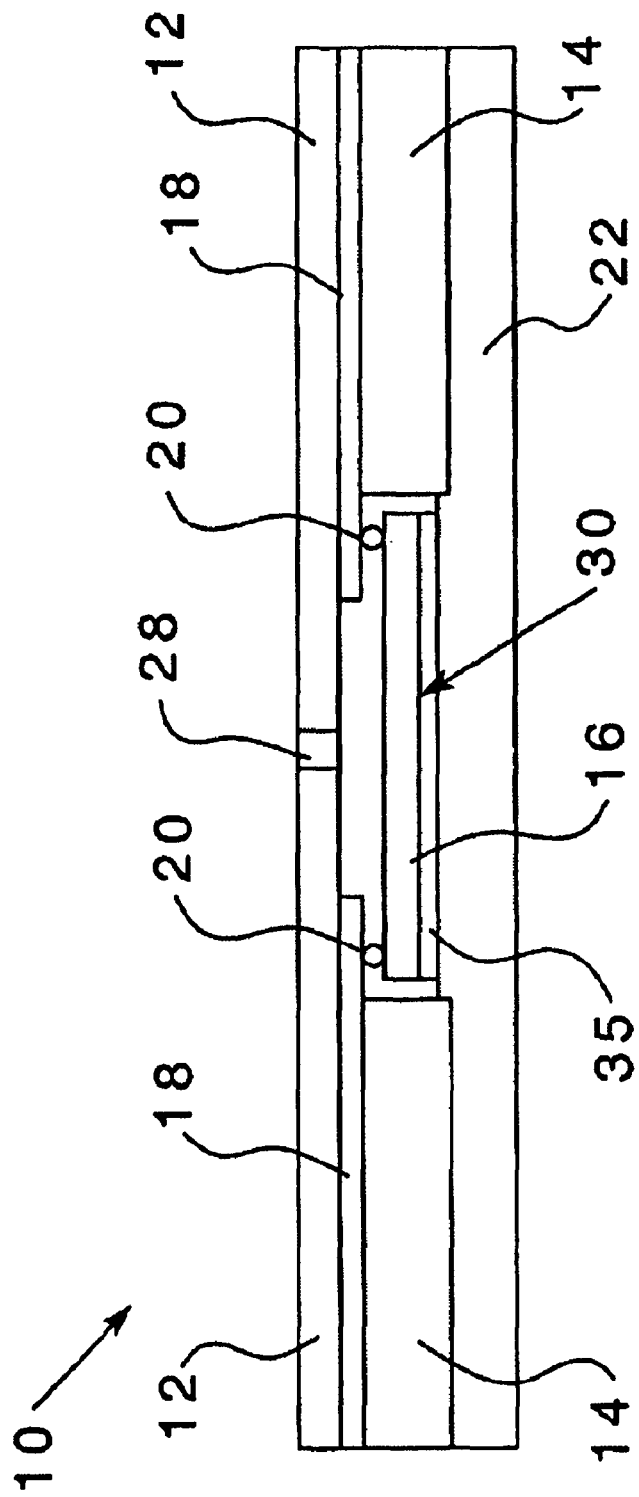

The circuit chip 16 may have electrically conductive bonding pads or electrodes for connection to the transmission lines 18 through the bumps 20, and may have a conductive portion at a lower surface 30 of the circuit chip 16. The conductive portion at the lower surface 30 may act as a signal ground for the chip 16, as well as provide for heat dissipation. A thin, electrically conductive shim 35, as shown in FIG. 3, may be attached to the conductive portion at the lower surface 30 of the chip 16. The chip 16 may be mounted to the substrate 12 using, for example, flip chip mounting techniques, such as thermal compression or epoxy bonding. It should be noted, however, that according to the present invention, unlike conventional flip chip bonding, the circuit chip 16 is not "flipped." Rather, the "top" or active surface of the circuit chip 16 is connected to the substrate 12, and the "bottom" or ground surface of the circuit chip 16 is not, thereby maintaining the orientation of the transmission fields for the chip 16 and the substrate 12, and obviating the need for wire bonding.

In addition, with the device 10 of the present invention, the ground plate 22 may provide a signal ground for the circuit chip 16, as well as a thermal conductor to facilitate the dissipation of heat from the circuit chip 16, if needed. In addition, with the circuit chip 16 disposed in a recessed portion 32 of the device 10, the ground plate 22 provides electromagnetic and environmental protection for the circuit chip 16. Consequently, the ground plate 22 may prevent electromagnetic radiation from the chip 16 from interfering with other devices, as well as prevent radiation from other devices from interfering with the operation of the chip 16. In addition, the ground plate 22 may prevent environmental conditions, such as moisture, from interfering with the operation of the chip 16.

Benefits of the present invention may be realized not only for devices 10 including a single circuit chip 16, as discussed hereinbefore with respect to FIG. 1, but may also be realized in devices 10 including a plurality of circuit chips 16, such as may be used for multi-chip modules (MCM) or subsystem modules. Thus, various embodiments of the present invention obviate the need to obtain pre-packaged chips in constructing a subsystem module, as is currently customary in the industry, because the chips 16 are packaged as part of the assembly process, thereby reducing the cost and size of the module.

Although the device 10 as illustrated in FIG. 1 includes two substrates 12, 14 and one transmission line layer for transmission lines 18, it can be understood that the device 10 can be constructed using any number of substrates and transmission line layers.

Figure 2:
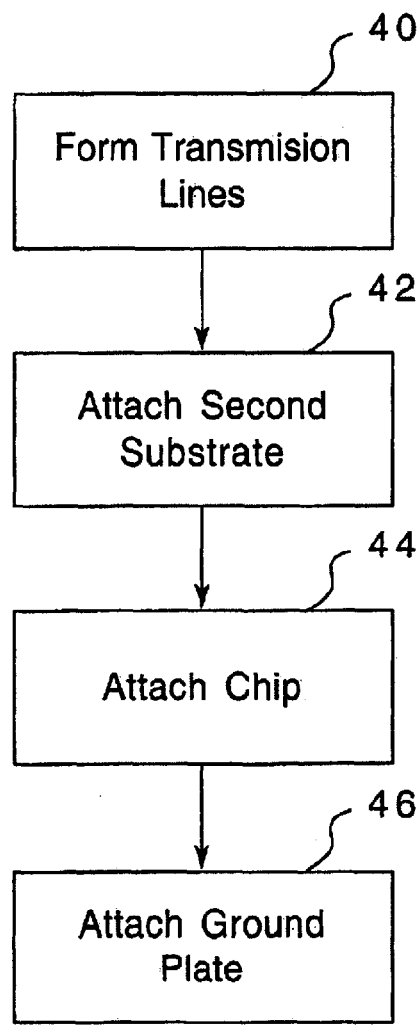
FIG. 2 is a flowchart illustrating the steps for fabricating a semiconductor device according to one embodiment of the present invention.

FIG. 2 is a flowchart illustrating the steps for fabricating a semiconductor device 10 according to one embodiment of the present invention. At step 40, the substrate 12 is processed using, for example, thick or thin film technology, to produce the transmission lines 18 on the lower surface 26 of the substrate 12. At step 42, the substrate 14 is attached to the substrate 12 using, for example, co-firing or lamination techniques such as epoxy bonding.

At step 44, the circuit chip 16 is attached to the transmission lines 18 and the substrate 12. To attach the chip 16 to the substrate 12, a thin, electrically conductive shim may be eutecticly attached to the lower surface 26 of the chip 16. The shim may have a surface area slightly larger than the chip 16 and may be made, for example, of a material having a coefficient of thermal expansion (CTE) matching the material comprising the chip 16. The shim may include, for example, an elemental metal or composite metal such as molybdenum, CuW, Cu/Mo/Cu, or aluminum silicon carbide. The shim facilitates chip-handling during the fabrication process and provides a buffer for thermal expansion mismatch. The bumps 20 may then be attached to the bonding pads of the chip 16 by ball bonders. It can be understood that the bumps 20 may be added by a wafer foundry during manufacturing of the circuit chip 18 or may be subsequently added during fabrication of the device 10. The chip 16 may then be attached to the lower surface 26 of the substrate 12 by, for example, thermal compression using a flip-chip die attach machine.

At step 46, the ground plate 22 is attached to the lower surface 24 of the substrate 14 and the shim on the lower surface 30 of the chip 16 with, for example, conductive epoxy. Consequently, the manufacture of the device 10 of the present invention may be fully automated. A lid (not shown) of, for example, ceramic or plastic, may be placed over the device 10, although it is not necessary. In addition, lead frames (not shown) may be bonded to the substrate 12 during the processing to provide for external connectivity of the device 10 if desired. A portion of the substrate 12 may be removed to expose the transmission lines 18 for such interconnection and circuitry composition. Also, vias may be formed in the substrate 12 to allow connections to the transmission lines 14 at the top surface 27 of the substrate 12.

Accordingly, the device 10 of the present invention provides a manner for interconnecting existing types of circuits chips 16, including microstrip-based MMICs, and a substrate 12 without the use of wire bonding or modification of the circuit. In addition, by using flip chip mounting techniques to interconnect the microwave circuit chip 16 and the substrate 12, the manufacturing process may be automated and the yield increased. Moreover, by eliminating wire bonding, the device 10 is more reproducible and consistent, thus reducing tuning requirements and providing enhanced yield and improved performance. Additionally, by connecting the ground plate 26 to the lower surface 30 of the chip 16, efficient and reliable thermal handling of the chip 16 is provided. Furthermore, the assembly technique of the present invention itself provides packaging for the circuit chip 16, thus obviating the need for additional packaging.

Although the present invention has been described herein with respect to certain embodiments, those of ordinary skill in the art will recognize that many modifications and variations of the present invention may be implemented. The foregoing description and the following claims are intended to cover all such modifications and variations. Furthermore, the materials and processes disclosed are illustrative, but are not exhaustive. Other materials and processes may also be used to make devices embodying the present invention. In addition, the described sequences of the processing may also be varied.

What is claimed is:

1. A device, comprising:
   a first substrate having a transmission line formed on a lower surface thereof;
   a second substrate connected to the first substrate and the transmission line such that the transmission line is substantially between the first substrate and a top surface of the second substrate; and
   a circuit chip having an upper surface and a lower surface, wherein at least one terminal on the upper surface is connected to the transmission line, and where the lower surface includes a conductive signal ground portion; and
   a ground plate connected to a bottom surface of the second substrate and directly connected to the lower surface of the circuit chip such that the ground plate provides a signal ground for the circuit chip.

2. The device of claim 1, wherein the circuit chip is connected to the transmission line via a conductive bump.

3. The device of claim 1, further comprising an isolation device located in the first substrate.

4. The device of claim 3, wherein the isolation device includes a microwave frequency absorbing material.

5. The device of claim 1, wherein the circuit chip includes a microwave circuit chip.

6. The microwave device of claim 5, wherein at least one of the first substrate and the second substrate is constructed of a microwave laminate material.

7. The microwave device of claim 5, wherein the ground plate is constructed of metal.

8. The microwave device of claim 5, wherein the ground plate is connected to the circuit chip and the second substrate with epoxy.

9. The microwave device of claim 5, wherein the conductive bump is constructed of material selected from the group consisting of gold and a conductive polymer.

10. The microwave device of claim 5, wherein the transmission line is constructed of a material selected from the group consisting of gold, silver, aluminum and copper.

11. The microwave device of claim 5, wherein the microwave circuit chip includes a monolithic microwave integrated circuit.

12. The microwave device of claim 5, further comprising a microwave isolation device located in the first substrate.

13. The device of claim 5, wherein the transmission line, the second substrate and the ground plate form a transmission medium having the same transmission field orientation as that of the circuit chip.

14. A method of fabricating a device, comprising:
    forming a transmission line on a bottom surface of a first substrate;
    attaching a second substrate to the bottom surface of the first substrate and the transmission line such that the transmission line is substantially between the first substrate and a top surface of the second substrate;
    attaching an upper surface of a circuit chip to the transmission line; and
    attaching a ground plate to a bottom surface of the second substrate and to a conductive signal ground portion of a lower surface of the circuit ship such that the ground plate is in direct contact with the conductive signal ground portion of the lower surface of the circuit chip such that the ground plate provides a signal ground for the circuit chip.

15. The method of claim 14, wherein attaching a second substrate to the bottom surface of the first substrate and the transmission line includes attaching the second substrate to the bottom surface of the first substrate and the transmission line using epoxy.

16. The method of claim 14, wherein attaching a circuit chip to the transmission line includes attaching a conductive bump to the circuit chip and attaching the bump to the transmission line.

17. The method of claim 14, wherein attaching the bump to the transmission line includes attaching the bump to the transmission line using thermal compression.

18. The method of claim 14, wherein attaching a ground plate to the second substrate includes attaching a ground plate to the second substrate using conductive epoxy.

19. A device, comprising:
    a first substrate having a transmission line formed on a lower surface thereof;
    a second substrate connected to the first substrate and the transmission line such that the transmission line is substantially between the first substrate and a top surface of the second substrate; and
    a circuit chip having an upper surface and a lower surface, wherein at least one terminal on the upper surface is connected to the transmission line, and where the lower surface includes a conductive signal ground portion;
    a ground plate connected to a bottom surface of the second substrate;
    an electrically conductive shim directly connected between the lower surface of the circuit chip and the ground plate such that the ground plate provides a signal ground for the circuit chip.

20. The device of claim 19, wherein the circuit chip includes a microwave circuit chip.

21. The device of claim 20, wherein the transmission line, the second substrate and the ground plate form a transmission medium having the same transmission field orientation as that of the microwave circuit chip.

22. The device of claim 19, further comprising an isolation device located in the first substrate.

23. The device of claim 22, wherein the isolation device includes a microwave frequency absorbing material.

24. A method of fabricating a device, comprising:
    forming a transmission line on a bottom surface of a first substrate;
    attaching a second substrate to the bottom surface of the first substrate and the transmission line such that the transmission line is substantially between the first substrate and a top surface of the second substrate;
    attaching an electrically conductive shim to a lower surface of a circuit chip, wherein the lower surface includes a conductive signal ground portion;
    attaching conductive bumps to an upper surface of the circuit chip;
    attaching the upper surface of a circuit chip to the transmission line through the conductive bumps;
    attaching a ground plate to a bottom surface of the second substrate and to the electrically conductive shim such that the ground plate provides a signal ground for the circuit chip.

* * * * *